United States Patent [19]
Sato et al.

[11] Patent Number: 5,808,943
[45] Date of Patent: Sep. 15, 1998

[54] SEMICONDUCTOR MEMORY AND METHOD OF MANUFACTURING THE SAME

[75] Inventors: Yasuo Sato; Shigeki Amano, both of Tokyo, Japan

[73] Assignee: Nippon Steel Corporation, Tokyo, Japan

[21] Appl. No.: 642,357

[22] Filed: May 3, 1996

Related U.S. Application Data

[63] Continuation-in-part of Ser. No. 362,860, Dec. 23, 1994, abandoned.

[30] Foreign Application Priority Data

Dec. 28, 1993 [JP] Japan .................................. 5-351866

[51] Int. Cl.$^6$ .................................................. G11C 7/00
[52] U.S. Cl. ........................................ 365/200; 365/230.06
[58] Field of Search ............................... 365/185.09, 200, 365/230.06

[56] References Cited

U.S. PATENT DOCUMENTS 5,233,566  8/1993  Imamiya et al. ................. 365/200 X
5,315,551  5/1994  Hirayama ............................ 365/200

FOREIGN PATENT DOCUMENTS 60-65545   4/1985  Japan .
62-139198  6/1987  Japan .
4-14700    1/1992  Japan .

*Primary Examiner*—Joseph A. Popek
*Attorney, Agent, or Firm*—Law Offices Pollock, Vande Sande & Priddy

[57] ABSTRACT

A semiconductor memory, such as Dynamic Random Access Memory (DRAM), is provided for replacing a defective memory cell with a spare memory cell. The DRAM includes a main section which has a memory cell array with a plurality of memory cells arranged in an array. A spare section having a spare memory cell array also includes a plurality of memory cells arranged in an array. An address decoder specifies addresses, respectively, of the main section array and the spare section array. A defective bit replacement control circuit is connected to the address decoder and includes a plurality of electrically rewritable nonvolatile memory cells. The address decoder conducts a change-over operation for specifying an address of the first or second arrays according to a storage state, i.e., contents, of electrically rewritable nonvolatile memory cells.

16 Claims, 12 Drawing Sheets

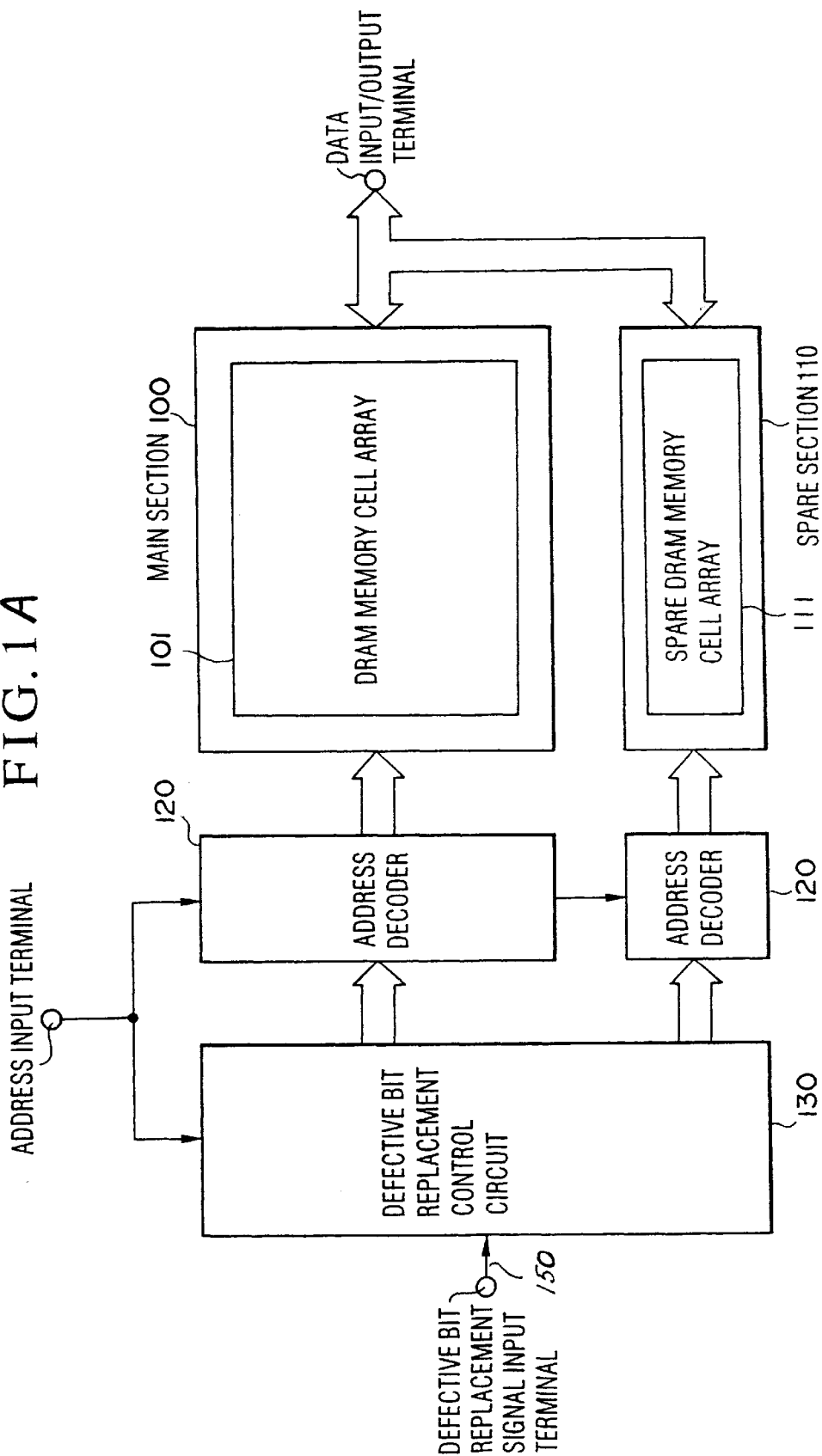

SEMICONDUCTOR MEMORY AND METHOD OF MANUFACTURING THE SAME

CROSS-REFERENCE TO RELATED APPLICATIONS

This is a Continuation-in-Part of U.S. patent application Ser. No. 08/362,860, filed Dec. 23, 1994, now abandoned.

FIELD OF THE INVENTION

The present invention relates to a semiconductor memory such as a dynamic random access memory (DRAM) and a method of manufacturing the memory.

BACKGROUND OF THE INVENTION

Conventionally, when producing a semiconductor memory such as a DRAM, a redundant circuit configuration has been employed to prevent yield of DRAM production from being lowered due to random defects in the production process. Namely, for example, a large number of memory cells are integrally formed in a DRAM chip to increase the memory capacity. Even if the chip includes only one defective memory cell, the chip is rejected and hence the production yield is decreased.

When a failure occurs in a memory cell with the redundant circuit configuration, the defect is recovered, for example, as follows. A word line or a bit line which is used to specify an address (via an address decoder) and which is connected to the defective memory cell is disconnected from the address decoder. Then a word line or a bit line connected to a spare or backup memory cell is connected to the address decoder. As a result, the failed memory cell is replaced with a reserve memory cell and hence the production yield is improved.

As a practical method of replacing the defective memory cell with a spare memory cell, there has been commonly adopted a laser fuse linking procedure. In this method, for example, a fuse is disconnected by a laser beam spot to replace the failed memory cell with a spare memory cell.

Also broadly employed is an electric fusing scheme in which the fuse is electrically melted down for the above purpose, which has been described in, for example, the JP-A-60-65545, JP-A-62-139198, and JP-A-414700.

However, the laser fusing method is attended with a disadvantage of a relatively complex process in which a target position of a laser beam is controlled according to information from a circuit tester. Moreover, the apparatus to illuminate a laser beam spot onto a target position is required to control the target position with a high precision. In addition, damage to peripheral circuits occurs when disconnecting the fuse. Similarly, the electric fusing method is also attended with disadvantageous features of adverse influence upon peripheral circuits and damage to a substrate of the memory when the fuse is electrically melted down.

SUMMARY OF THE INVENTION

It is therefore an object of the present invention to provide a semiconductor memory and a method of fabricating the memory in which a failed memory cell can be replaced with a memory cell of a redundant circuit without damaging the peripheral circuits and the substrate.

The present invention provides a semiconductor memory for replacing a defective memory cell with a spare memory cell. A main section includes a first array of first memory cells, wherein each of the first memory cells includes a metal-oxide-semiconductor transistor and a capacitor. A spare section includes a second array of the first memory cells which constitutes replacement memory cells for the main section first array. An address decoder specifies an address within the first and second arrays. A control circuit is connected to the address decoder for controlling a defective bit replacement operation such that an address specified for the first array is disabled and an address specified for the second array is enabled in response to the control circuit. Means for disabling and enabling an address include a plurality of electrically erasable, nonvolatile second memory cells which have a state determined by the control circuit to disable addressing of a defective memory cell location in the first array and to enable addressing of a replacement memory cell in the second array.

A semiconductor memory according to one embodiment of the present invention comprises a main section which includes a first memory cell array having a plurality of first memory cells, each of the first memory cells including one metal-oxide semiconductor transistor and one capacitor. A spare section includes a second memory cell array having a plurality of first memory cells, the spare section constituting a redundant circuit. An address decoder specifies addresses respectively of the first and second memory cell arrays. A defective bit replacement control circuit is connected to the address decoder. The control circuit includes a plurality of second memory cells for controlling access to the main and spare section memory cells. Each of the second memory cells is an electrically rewritable and nonvolatile memory cell. The address decoder conducts a change-over operation for specification of an address of the first or second memory cell array according to a storage state of the second memory cells. When a defective cell from the main section is disabled by changing its state of one of the second memory cells, the state of another of the second memory cells is also changed to enable one of the memory cells of the spare section as a replacement thereto.

In the semiconductor memory according to the present invention, since an electrically rewritable nonvolatile memory cell is used in place of a fuse, damages to the peripheral circuits and the substrate can be avoided which conventionally occur when the fuse is disconnected.

A first method of manufacturing a semiconductor memory according to the present invention includes the semiconductor memory comprising a main section including a first memory cell array which has a plurality of first memory cells, each of the first memory cells including one metal-oxide-semiconductor transistor and one capacitor. A spare section includes a second memory cell array which has a plurality of first memory cells, the spare section constituting a redundant circuit. An address decoder specifies addresses respectively of the first and second memory cell arrays. A defective bit replacement control circuit is connected to the address decoder. The control circuit includes a plurality of second memory cells, each of the second memory cells being an electrically rewritable and nonvolatile memory cell and of a floating-gate type including a floating gate and a control gate. The address decoder conducts a change-over operation for specification of an address of the first or second memory cell array according to a storage state of the second memory cells. The method comprises a first step of forming first insulation layers, respectively, on a semiconductor substrate in a first element forming region in which the first memory cell is formed, and in a second element forming region in which the second memory cell is formed.

A second step includes forming first conductive layers in predetermined patterns, respectively, on the first insulation layer in the first element forming region and on the first insulation layer in the second element forming region.

A third step includes conducting ion implantation on the semiconductor substrate with the first conductive layers as a mask, thereby forming a pair of impurity diffusion layers, respectively, in the first and second element forming regions.

A fourth step includes forming a second insulation layer on the overall surface of the semiconductor substrate.

A fifth step includes producing a first hole in the second insulation layer, the first hole extending to one of the paired impurity diffusion layers in the first element forming region and a second hole in the second insulation layer, the second hole extending to the first conductive layer in the second element forming region.

A sixth step includes forming second conductive layers which fill the first and second holes, respectively.

A seventh step includes forming dielectric layers, respectively, on at least a surface of the second conductive layer in the first element forming region and on at least a surface of the second conductive layer in the second element forming region.

An eighth step includes forming third conductive layers, respectively, on at least a surface of the dielectric layer in the first element forming region and on at least a surface of the dielectric layer in the second element forming region.

A second method of manufacturing a semiconductor memory according to the present invention includes the semiconductor memory comprising a main section including a first memory cell array which has a plurality of first memory cells, each of the first memory cells including one metal-oxide-semiconductor transistor and one capacitor. A spare section includes a second memory cell array which has a plurality of first memory cells, the spare section constituting a redundant circuit. An address decoder specifies addresses respectively of the first and second memory cell arrays. A defective bit replacement control circuit is connected to the address decoder, wherein the control circuit includes a plurality of second memory cells, each of the second memory cells being an electrically rewritable and nonvolatile memory cell and of a floating-gate type including a floating gate and a control gate. The address decoder conducts a change-over operation for specification of an address of the first or second memory cell array according to a storage state of the second memory cells. The method comprises a first step of forming first insulation layers, respectively, on a semiconductor substrate in a first element forming region in which the first memory cell is formed and in a second element forming region in which the second memory cell is formed.

A second step includes forming first conductive layers in predetermined patterns, respectively, on the first insulation layer in the first element forming region and on the second insulation layer in the second element forming region.

A third step includes conducting ion implantation into the semiconductor substrate with the first conductive layers as a mask and thereby forming a pair of impurity diffusion layers, respectively, in the first and second element forming regions.

A fourth step includes forming a second insulation layer on an overall surface of the semiconductor substrate.

A fifth step includes producing a first hole in the second insulation layer, the first hole extending to one of the paired impurity diffusion layers in the first element forming regions, and a second hole in the second insulation layer, the second hole extending to the first conductive layer in the second element forming region.

A sixth step includes forming a second conductive layer on the overall surface of the semiconductor substrate, patterning the second conductive layer by etching, and forming a pattern of the second conductive layer in the first element forming region.

A seventh step includes forming dielectric layers, respectively, on at least a surface of the second conductive layer in the first element forming region and on at least the first conductive layer, which is exposed in a portion of the second hole, in the second element forming region.

An eighth step includes forming third conductive layers, respectively, on at least a surface of the dielectric layer in the first element forming region and on at least a surface of the dielectric layer in the second element forming region.

In the first and second methods of manufacturing a semiconductor memory according to the present invention, nonvolatile memory cells of a floating-gate type can be manufactured simultaneously together with, for example, DRAM memory cells without increasing the number of manufacturing processes.

BRIEF DESCRIPTION OF THE DRAWINGS

These and other objects and advantages of the present invention will become apparent by reference to the following description and accompanying drawings wherein:

FIG. 1A is a block diagram showing the configuration of one embodiment of a semiconductor memory (DRAM) according to the present invention.

DESCRIPTION OF THE PREFERRED EMBODIMENTS

Figure 1B:
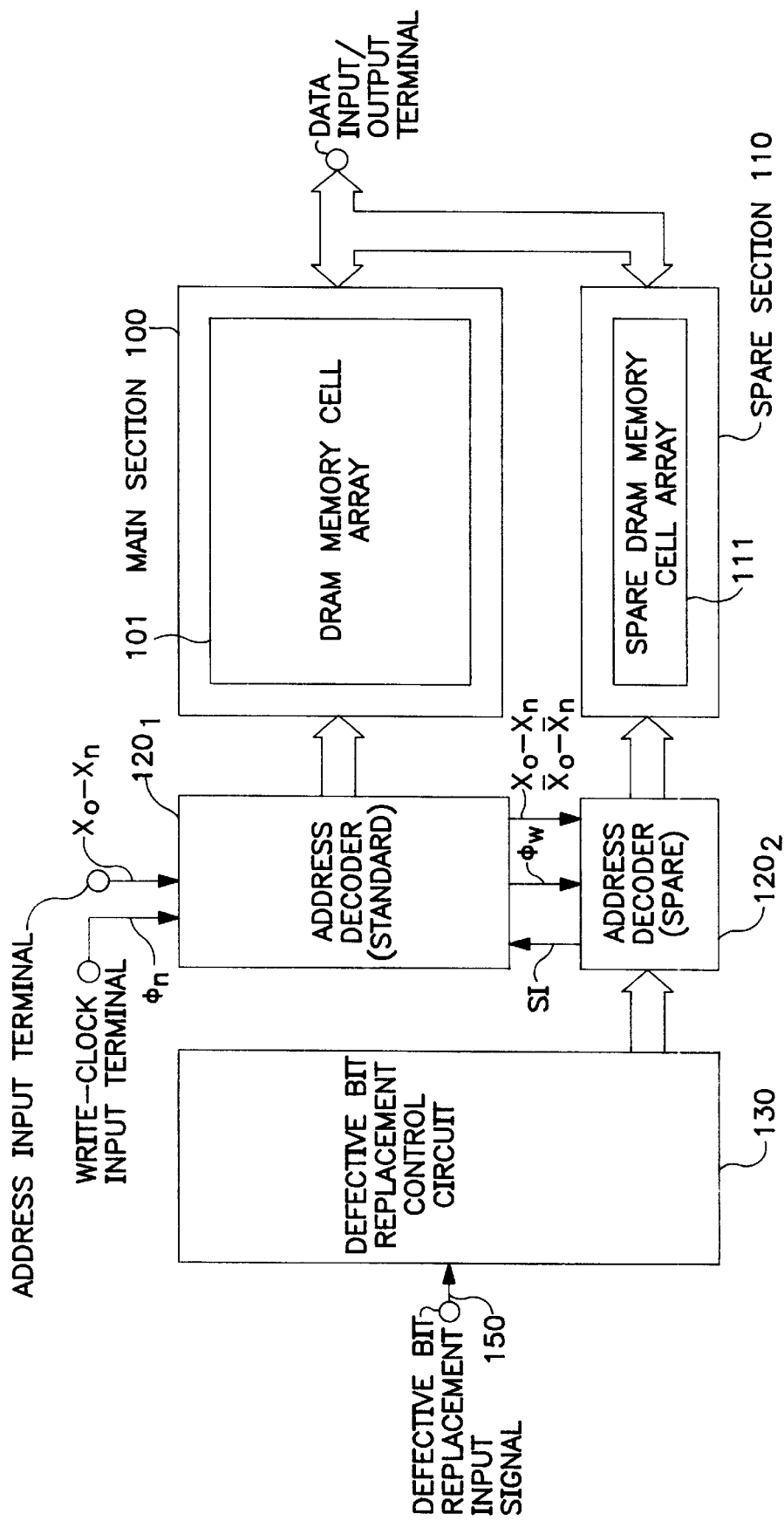
FIG. 1B is a block diagram showing the configuration of another embodiment of a semiconductor memory (DRAM) in accordance with the present invention.

Description will now be given of a DRAM in one embodiment of a semiconductor memory according to the present invention. As shown in FIG. 1A, the DRAM includes a main section 100 including a DRAM memory cell array 101 constituted by a plurality of DRAM memory cells 23 (referring to FIG. 2) arranged in the form of an array. A spare section 110 as a redundant circuit section includes a spare DRAM memory cell array 111 constituted by a plurality of DRAM memory cells 23 arranged in the form of an array. An address decoder 120 specifies addresses respectively of the arrays 101 and 111. A defective bit replacement control circuit 130 is connected to the address decoder 120 and includes a plurality of electrically rewritable nonvolatile memory cells 24 (referring to FIG. 3).

Figure 2:
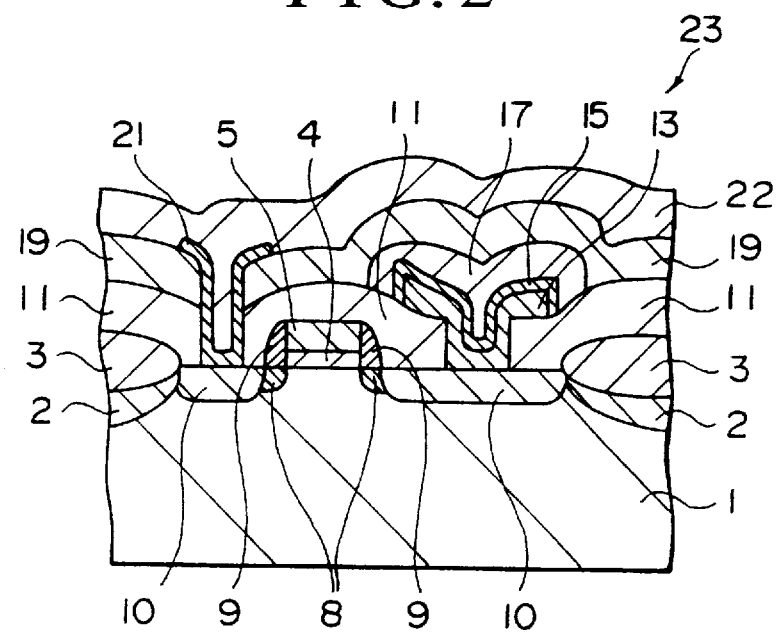
FIG. 2 is a cross-sectional view showing the structure of a DRAM memory cell constituting a DRAM memory array and a spare DRAM memory array of FIG. 1A and 1B.

The DRAM memory cell 23 includes, as shown in FIG. 2, a metal-oxide-semiconductor (MOS) transistor and a capacitor. The transistor includes a gate oxide layer 4, a gate electrode 5 formed on the layer 4, sidewall spacers 9 fabricated respectively on both sides of the electrode 5, a pair of n⁻-type impurity diffusion layers 8 manufactured in a silicon substrate 1 below the spacers 9, and a pair of n⁺-type impurity diffusion layers 10 formed respectively on outer sides of the layers 8. The capacitor includes a lower electrode 13, a dielectric layer 15, and an upper electrode 17. The nonvolatile memory cell 24 includes, as can be seen from FIG. 3, a tunnel oxide layer 6, a floating gate lower portion 7' formed on the layer 6, a floating gate upper portion 7" manufactured on the lower portion 7', a dielectric layer 16 formed so as to cover the upper portion 7', a control gate 18 manufactured so as to cover the dielectric layer 16, sidewall spacers 9 fabricated respectively on both sides of the lower portion 7', a pair of n⁻-type impurity diffusion layers 8 formed in a silicon substrate 1 below the spacers 9, and a pair of n⁺-type impurity diffusion layers 10 formed respectively on outer sides of the layers 8.

In the DRAM of this embodiment, when a defect takes place in any one of the plural cells 23 constituting the array 101 of the main section 100, a word (or bit) line specifying an address of the defective cell 23 is disconnected from the address decoder 120. One of the plural nonvolatile memory cells 24 which is associated with the defective cell 23 is changed from ON to OFF by a defective bit replacement signal 150 supplied to the replacement control circuit 130. In association therewith, to connect the address decoder 120 to a word (or bit) line to be used for the spare cell 23 of the spare cell array 111, one other of the nonvolatile memory cells 24, which is associated with the spare cell 23, is changed from OFF to ON by the defective bit replacement signal 150 supplied to the replacement control circuit 130.

In the embodiment above, the nonvolatile memory cells are of the floating-gate type. However, memory cells of the metal-nitride-oxide-semiconductor (MNOS) type in which electric charge is accumulated in a boundary between a silicon nitride layer and a silicon oxide layer may be also employed.

Figure 12:
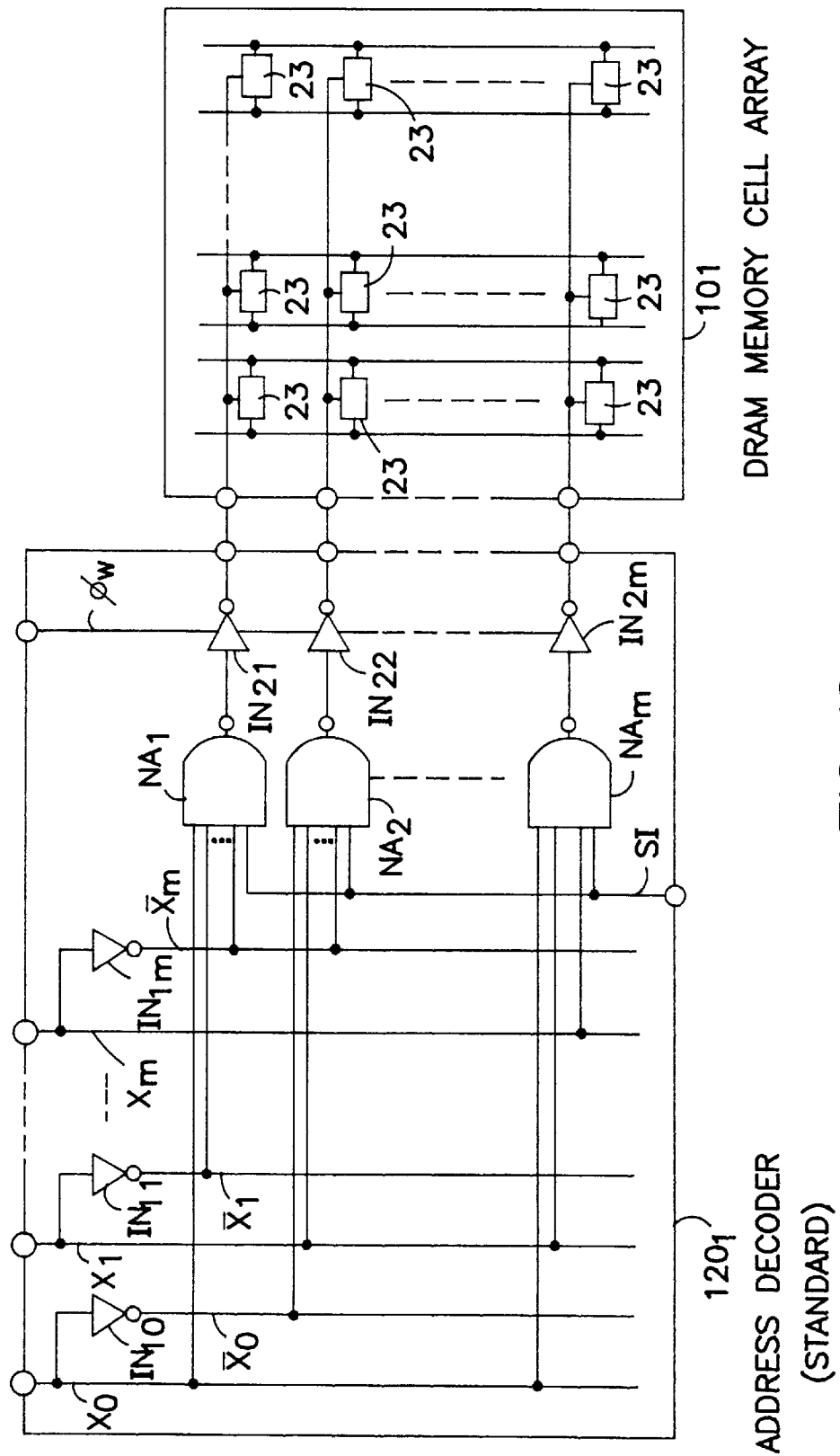
FIG. 12 is a block diagram of the address decoder (standard) shown in FIG. 1B.
Figure 13:
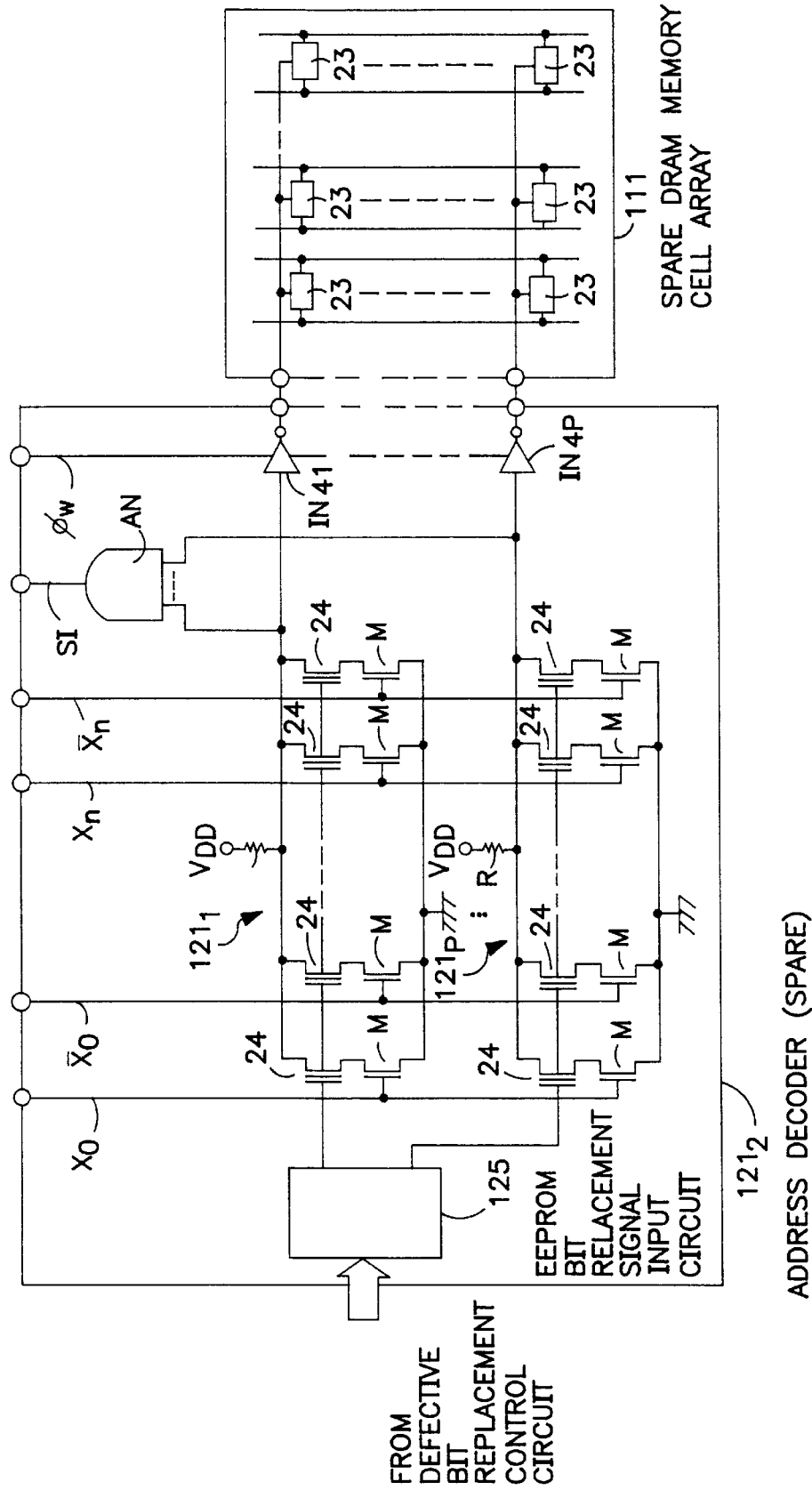
FIG. 13 is a block diagram of the address decoder (spare) shown in FIG. 1B.

FIG. 1B, 12 and 13 show another embodiment of a semiconductor memory (DRAM) in accordance with the present invention, where the same reference characters in all figures denote the same or identical components of the present invention.

As shown in FIG. 12, the address decoder (standard) $120_1$ comprises a plurality of inverters $IN_{10}$–$IN_{1n}$, a plurality of NAND circuits $NA_1$–$NA_m$, and a plurality of clocked inverters $IN_{21}$–$IN_{2m}$. In the inverters $IN_{10}$–$IN_{1n}$, the polarities of address signals $X_o$–$X_n$ which are inputted to the address decoder (standard) $120_1$ through address input terminals are inverted, respectively. In the NAND circuits $NA_1$–$NA_m$, the address signals $X_o$–$X_n$ are decoded. The output signals of the NAND circuits $NA_1$–$NA_m$ are inputted to the memory cells 23 in the DRAM memory cell array 101 through the clocked inverters $IN_{21}$–$IN_{2m}$ which operate while a write-clock $\phi_w$ is high. The write-clock $\phi_w$ is inputted to the address decoder (standard) $120_1$ through a write-clock input terminal. However, the address signals $X_o$–$X_n$ are decoded only while a select inhibit signal SI, which is inputted from the address decoder (spare) $120_2$ to the NAND circuits $NA_1$–$NA_m$, is high.

As shown in FIG. 13, the address decoder (spare) $120_2$ comprises an EEPROM bit replacement signal input circuit 125, a plurality of address generation circuits $121_1$–$121_p$, an AND circuit AN, and a plurality of clocked inverters $IN_{41}$–$1N_{4p}$. Each of the address generation circuits $121_1$–$121_p$ comprises a plurality of circuits each of which has the electrically rewritable nonvolatile memory cell 24 and a MOS transistor M which are connected in series. The drain of each electrically rewritable nonvolatile memory cells 24 is connected to a power source $V_{DD}$ through a resistor R. The control gate of each electrically rewritable nonvolatile memory cells 24 is connected to the EEPROM bit replacement signal input circuit 125. In each of the address generation circuits $121_1$–$121_p$, the address signals $X_o$–$X_n$, $\overline{X}_o$–$\overline{X}_n$ are inputted to the gates of the MOS transistors M, respectively. The source of each MOS transistors M is connected to the ground. The output signals of the address generation circuits $121_1$–$121_p$ are inputted to the AND circuit AN, respectively. The output signals of the address generation circuits $121_1$–$121_o$ are also inputted to the memory cells 23 in the spare DRAM memory cell array 111 through the clock inverters $IN_{41}$–$IN_{4p}$ which operate while the write-clock $\phi_w$ is high.

When a defective memory cell is detected in the DRAM memory cell array 101, the address information of the defective memory cell is transmitted from the defective replacement control circuit 130 to the EEPROM bit replacement signal input circuit 125. Then, the address of the defective memory cell is written in the electrically rewritable nonvolatile memory cells 24 of the address generation circuits $121_1$ by the EEPROM bit replacement signal input circuit 125.

When the address signals $X_o$–$X_n$, $\overline{X}_o$–$\overline{X}_n$ which correspond to the address of the defective memory cell are inputted to the gates of the MOS transistors M of the address generation circuits $121_1$, the output signal of the address generation circuits $121_1$ becomes low. As a result, the output signal of the address generation circuits $121_1$ is inputted to the spare DRAM memory cell array 111 through the clocked inverter $IN_{41}$, so that data which should be stored in the defective memory cell is stored in the memory cells 23 of the spare DRAM memory cell array 111.

Further, the output signal of the address generation circuits $121_1$, which has low level, is inputted to the AND circuit AN, so that the select inhibit signal SI becomes low. As a result, the data is not stored in the memory cells 23 of the DRAM memory cell array 101.

Figure 3:
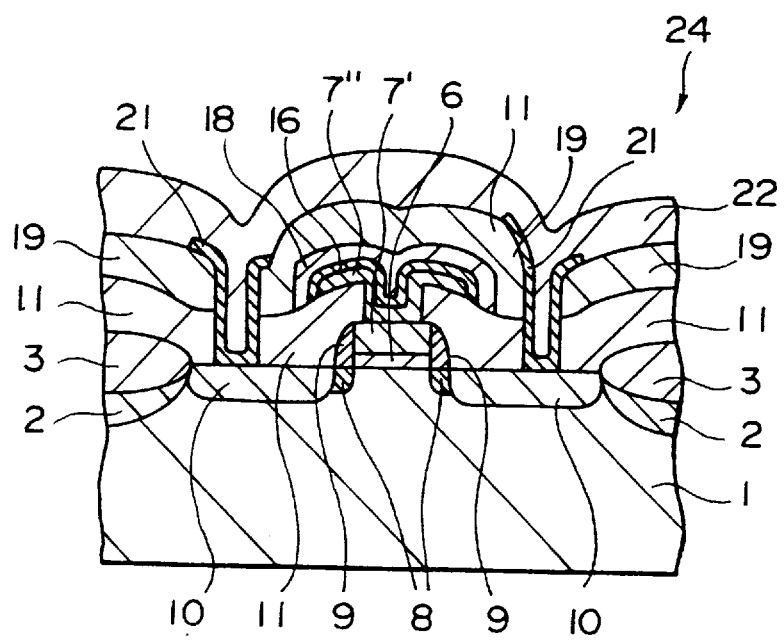
FIG. 3 is a cross-sectional view showing the structure of a nonvolatile memory cell constituting a circuit to control replacement of a defective bit in FIG. 1A and 1B.

Referring next to FIGS. 4A to 4D and 5A to 5D, description will be given of one method of manufacturing the DRAM of FIG. 1A and 1B. This is the first embodiment of the first semiconductor manufacturing method according to the present invention in which DRAM memory cells of FIG. 2 are formed in a first element forming region R1 of a silicon substrate 1 and then nonvolatile memory cells 24 of FIG. 3 are fabricated in a second element forming region R2 of the silicon substrate 1.

Figure 4A:
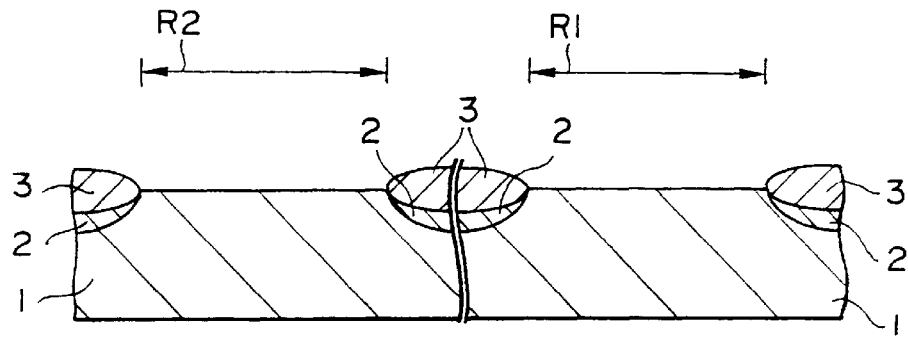
FIGS. 4A to 4D are diagrams for explaining the first half portion of processes of producing the DRAM of FIG. 1 in which DRAM memory cells of FIG. 2 are formed in a first element forming region of a silicon substrate and then nonvolatile memory cells of FIG. 3 are fabricated in a second element forming region of the silicon substrate (a first embodiment of a first semiconductor memory manufacturing method according to the present invention).

On the p-type silicon substrate 1, a silicon oxide layer and a silicon nitride layer, which are not shown, are sequentially manufactured as pads. Using a photoresist layer (not shown) as a mask thereon, anisotropic dry etching is conducted to remove the silicon nitride layer in other than element forming regions R1 and R2. An impurity substance is injected by ion implantation, for example, $BF_2$ into the silicon substrate 1 to prepare p+-type impurity diffusion layers 2 functioning as channel stoppers as shown in FIG. 4A.

After the photoresist layer is removed, the exposed surface is washed. In an $H_2O$ atmosphere, the substrate 1 is subjected to a thermal treatment at a temperature of 1100° C. to selectively oxidize the silicon substrate 1 (LOCOS) so as to fabricate element insulation layers 3 in element separation regions other than the regions R1 and R2. Thereafter, the silicon nitride layer as the mask for the thermal treatment is removed.

Figure 4B:
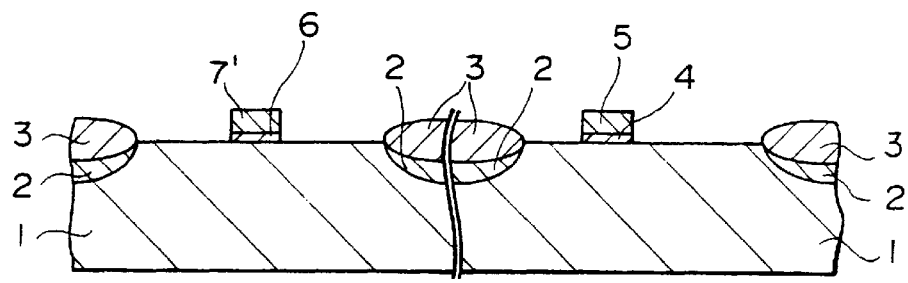

Subsequently, as shown in FIG. 4B, the sacrifice oxide film (not shown) is formed and then removed. Thereafter, a silicon oxide layer having a film thickness of about 10 nanometers (nm) to about 20 nm is fabricated on the overall regions R1 and R2 to be used as a gate oxide layer 4 in the first element forming region R1 and as a tunnel oxide layer 6 of the nonvolatile memory cells in the second element forming region R2 (first step). After injecting impurity, for example, $BF_2$ to control a threshold value into the silicon substrate 1, a polycrystalline silicon film is manufactured on the overall surface. An ion implantation of n-type impurity atoms, for example, phosphor (P) is conducted on the polycrystalline silicon layer to form an n-type polycrystalline silicon layer. Applied onto the n-type layer is photoresist (not shown) to be subjected to a patterning process. Using the patterned photoresist as a mask, anisotropic dry etching is carried out on the polycrystalline silicon layer to form a gate electrode 5 of the MOS transistor in the first region R1 and a floating gate lower portion 7' of the nonvolatile memory cell 24 in the second region R2 (second step). Then, the anisotropic dry etching may be carried out either on only the polycrystalline silicon layer or on both the silicon oxide layer and the polycrystalline silicon layer.

Figure 4C:
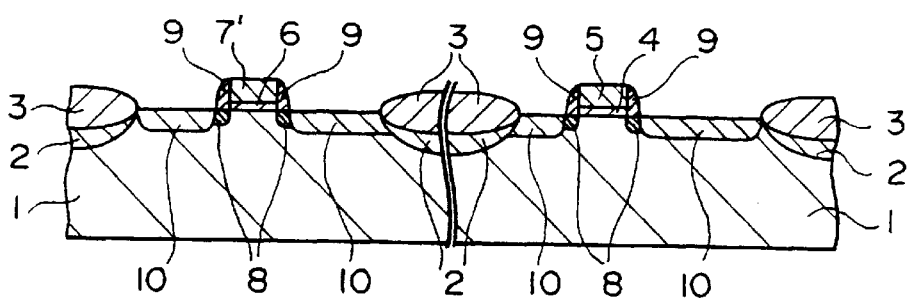

After removing the photoresist, as shown in FIG. 4C, using the element isolation layer 3, the gate electrode 5, and the floating gate lower portion 7' as mask elements, n-type impurity atoms, for example, phosphor are injected into the overall surface of the silicon substrate 1 to fabricate a pair of n⁻-type impurity diffusion layers 8 in the first and second regions R1 and R2. Forming a silicon oxide film on the overall surface of the substrate 1, anisotropic dry etching is conducted on the silicon oxide film to manufacture a pair of sidewall spacers 9 on both sides of each of the gate electrode 5 and the floating gate lower portion 7'. Thereafter, using the element isolation layer 3, the gate electrode 5, the floating gate lower portion 7', and the sidewall spacers 9 as mask elements, n-type impurity atoms, for example phosphor, are implanted into the entire surface of the silicon substrate 1 to manufacture a pair of $n^+$-type impurity diffusion layers 10 respectively in the first and second regions R1 and R2 (third step). As a result, an impurity diffusion layer having a lightly doped drain (LDD) structure is fabricated in the silicon substrate.

Figure 4D:
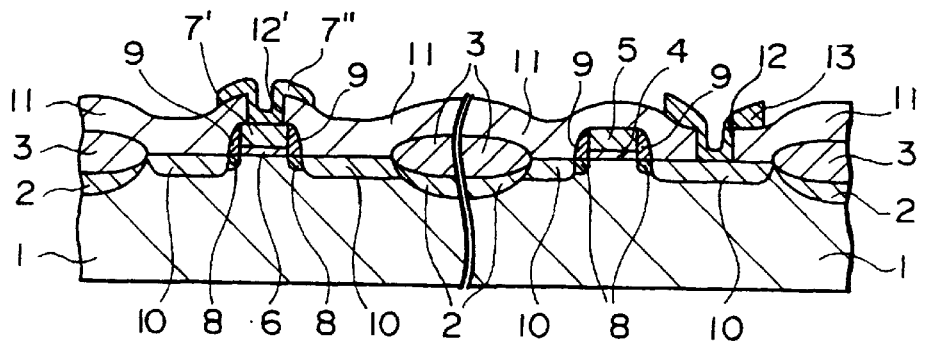

Next, as shown in FIG. 4D, a silicon oxide film 11 is formed on the overall surface of the silicon substrate 1 (fourth step). Thereafter, using photoresist (not shown) as an etching mask, anisotropic dry etching is carried out to remove the silicon oxide layer 11 on the $n^+$-type impurity diffusion layer 10 in the first region R1 and on the floating gate lower portion 7' in the second region R2 so as to produce contact holes 12 and 12' at the same time (fifth step). After removing the photoresist from the substrate 1, a polycrystalline silicon film is formed on the overall surface of the substrate 1. Injecting n-type impurity atoms, for example phosphor, into the polycrystalline silicon film by ion implantation, an n-type polycrystalline silicon film is obtained. Photoresist (not shown) is patterned on the obtained n-type film. Utilizing the photoresist as a mask, the n-type silicon film is etched to manufacture a capacitor lower electrode 13 in the first region R1 and a floating gate upper portion 7" in the second region R2 (sixth step). The photoresist is then removed from the silicon substrate 1.

Figure 5A:
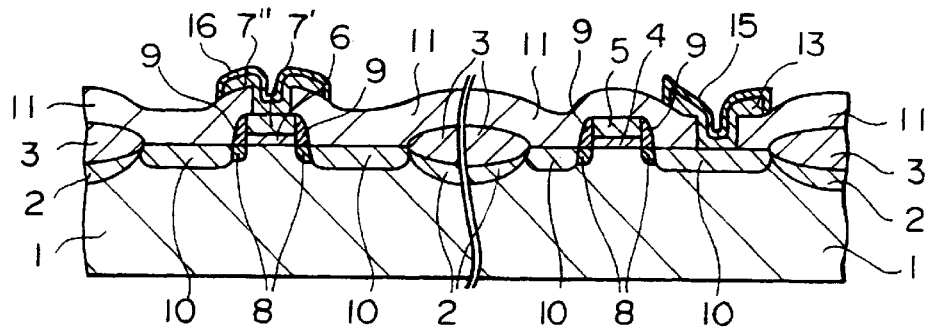
FIGS. 5A to 5D are diagrams for explaining the second half portion of the DRAM fabricating processes associated with FIGS. 4A to 4D.

Subsequently, as shown in FIG. 5A, using an oxide-nitride-oxide (ONO) layer including a silicon oxide layer, a silicon nitride layer, and a silicon oxide layer, a capacitor dielectric layer 15 is formed to cover the capacitor lower electrode 13 in the first region R1, and a dielectric layer 16 is formed to cover the floating gate upper portion 7" in the second region R2 (seventh step). In this step, in place of the ONO layer, a dielectric layer of such a ferroelectric substance as tantalum oxide ($Ta_2O_5$) or lead (Pz) zirconate titanate (PZT) may be formed.

Figure 5B:
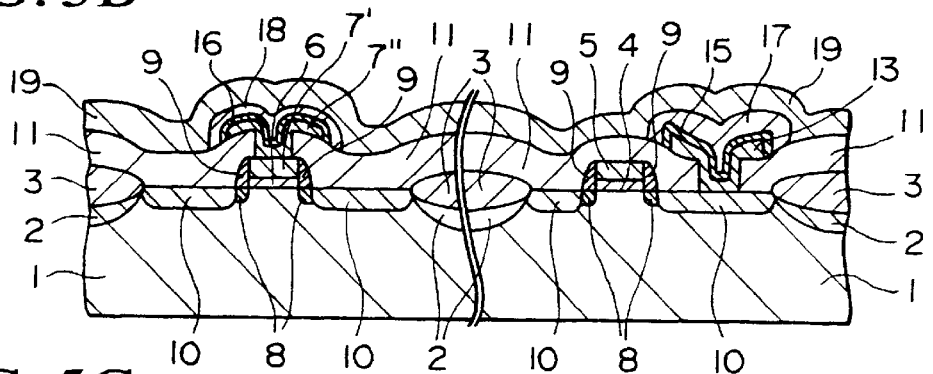

Next, as shown in FIG. 5B, a polycrystalline silicon layer is formed on the overall surface of the silicon substrate 1, and then n-type impurity atoms of, for example, phosphor are injected into the polycrystalline silicon layer by ion implantation to obtain an n-type polycrystalline silicon layer. Thereafter, photoresist (not shown) is patterned on the obtained n-type film. Using the photoresist as a mask, the n-type polycrystalline silicon layer is etched to fabricate a capacitor upper electrode 17 in the first region R1 and a control gate 18 in the second region R2 (eighth step). After removing the photoresist, a silicon oxide layer 19 is formed on the entire surface of the substrate 1.

Figure 5C:
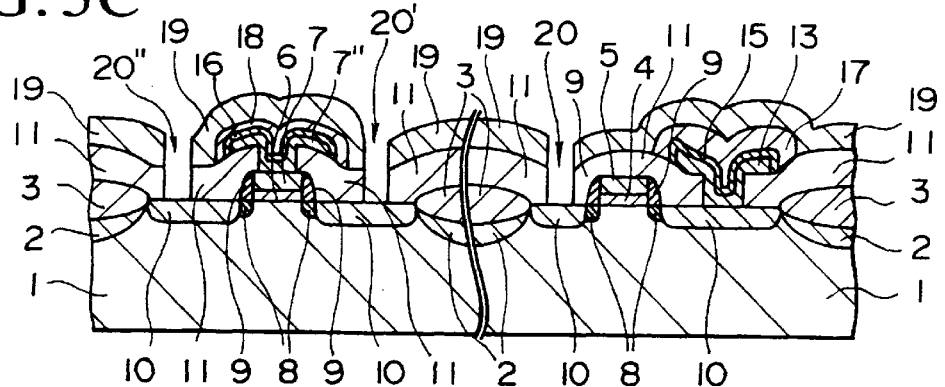

As shown in FIG. 5C, photoresist (not shown) is applied onto the overall surface of the silicon substrate 1 to be patterned thereafter. Using the photoresist as a mask, the n-type polycrystalline silicon layer is subjected to anisotropic dry etching to fabricate contact holes 20, 20' and 20" respectively on the $n^+$-type impurity diffusion layer 10 as a source in the first region R1 and on the paired $n^+$-type impurity diffusion layers 10 respectively as source and drain regions in the second region R2.

Figure 5D:
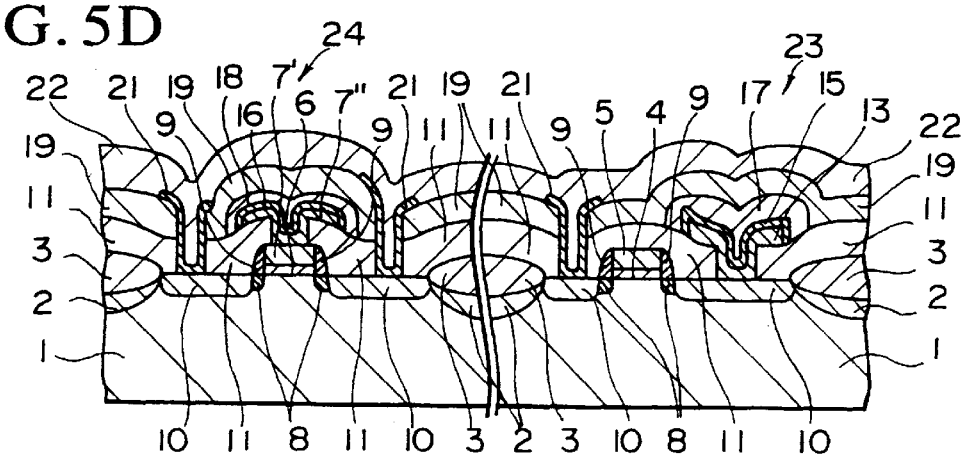

As shown in FIG. 5D, after removing the photoresist, aluminum is sputtered onto the overall surface of the silicon substrate 1 to form an aluminum layer. Photoresist (not shown) is patterned on the aluminum layer. Using the photoresist as a mask, an aluminum wiring region 21 in a desired pattern is formed. After removing the photoresist, a silicon oxide layer 22 is formed on the entire surface of the substrate 1.

As a result of the above processes, a DRAM memory cell 23 of the one-transistor-per-capacitor type is fabricated in the first element forming region R1, and an electrically rewritable nonvolatile memory cell 24 is fabricated in the second element forming region R2.

According to the DRAM manufacturing method described above, when producing the DRAM memory cell 23 on the silicon substrate 1 in an ordinary MOS production, the nonvolatile memory cell 24 of the floating gate type can be fabricated on the silicon substrate 1 without increasing the number of production processes.

Referring now to FIGS. 6A to 6D and 7A to 7D, description will be given of another method of manufacturing the DRAM of FIG. 1A and 1B. This is the second embodiment of the first semiconductor manufacturing method according to the present invention. A DRAM memory cell having a structure similar to the DRAM memory cell 23 of FIG. 2 is fabricated in the first element forming region R1 of the silicon substrate 1, and a nonvolatile memory cell having a structure similar to the nonvolatile memory cell 24 of FIG. 3 is formed in the second element forming region R2 of the substrate 1.

Figure 6A:
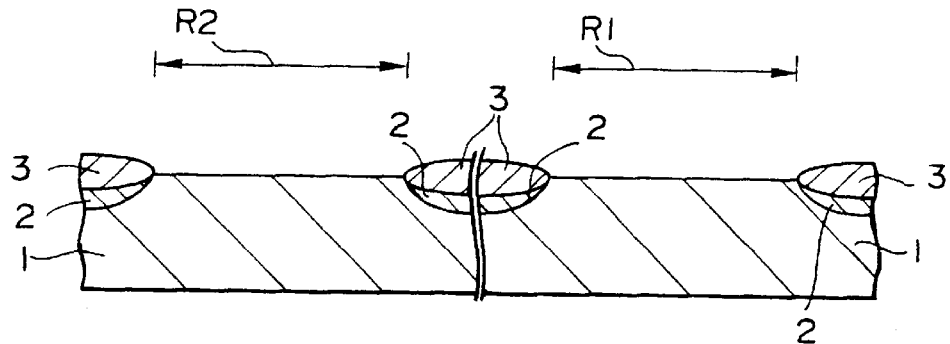
FIGS. 6A to 6D are diagrams for explaining the first half portion of processes of producing the DRAM in the second embodiment of the first semiconductor memory manufacturing method according to the present invention in which DRAM memory cells of FIG. 2 are formed in a first element forming region of a silicon substrate and then nonvolatile memory cells of FIG. 3 are fabricated in a second element forming region of the silicon substrate.
Figure 6B:
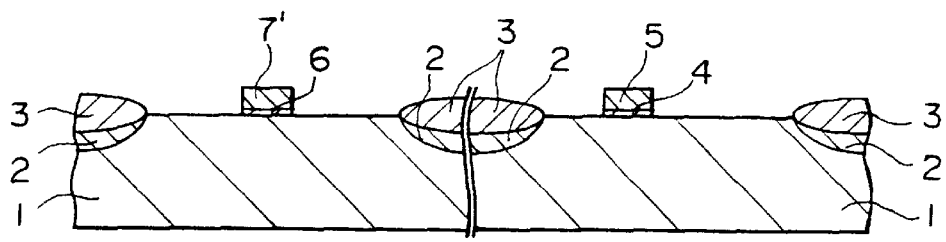
Figure 6C:
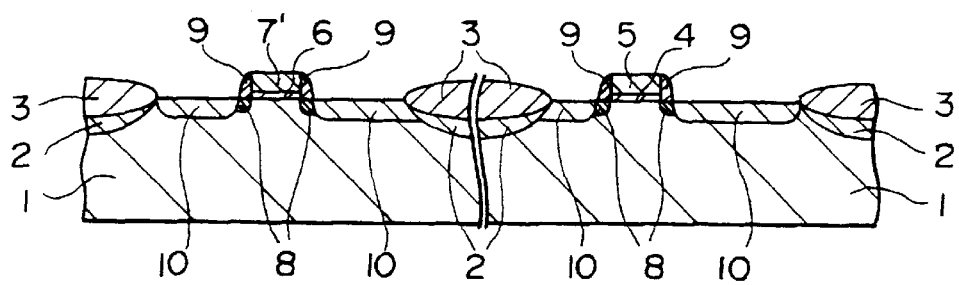

FIGS. 6A to 6C show semiconductor manufacturing processes corresponding to those of FIGS. 4A to 4C of the first semiconductor manufacturing method according to the present invention. After the processes of FIGS. 6A to 6C, a manufacturing process is conducted as shown in FIG. 6D.

Figure 6D:
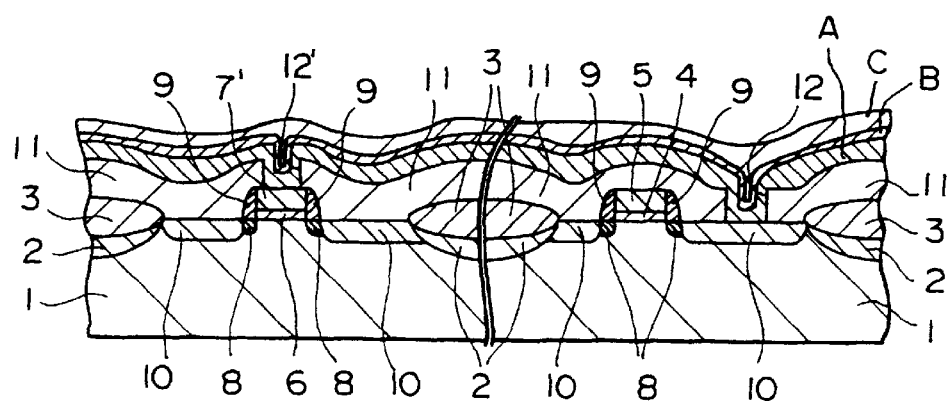

As shown in FIG. 6D, a silicon oxide layer 11 is formed on the overall surface of the silicon substrate 1. Anisotropic dry etching is conducted on the layer 11 using photoresist (not shown) as a mask to remove the silicon oxide layer 11 on the n$^+$-type impurity diffusion layer 10 as a drain in the first region R1 and on the floating gate lower portion 7' in the second region R2, thereby producing contact holes 12 and 12' at the same time. After removing the photoresist, a polycrystalline silicon layer A is formed on the overall surface of the silicon substrate 1, and then n-type impurity atoms of, for example, phosphor are injected into the layer A to obtain an n-type polycrystalline silicon layer A.

Next, using an ONO layer, a dielectric layer B is formed in the first and second regions R1 and R2. In place of the ONO layer, a ferroelectric layer of tantalum oxide (Ta2O5) or PZT may be employed.

Next, a polycrystalline silicon layer C is fabricated on the overall surface of the silicon substrate 1, and then n-type impurity atoms of phosphor, for example, are injected into the polycrystalline silicon layer C by ion implantation to attain an n-type polycrystalline silicon layer C.

Figure 7A:
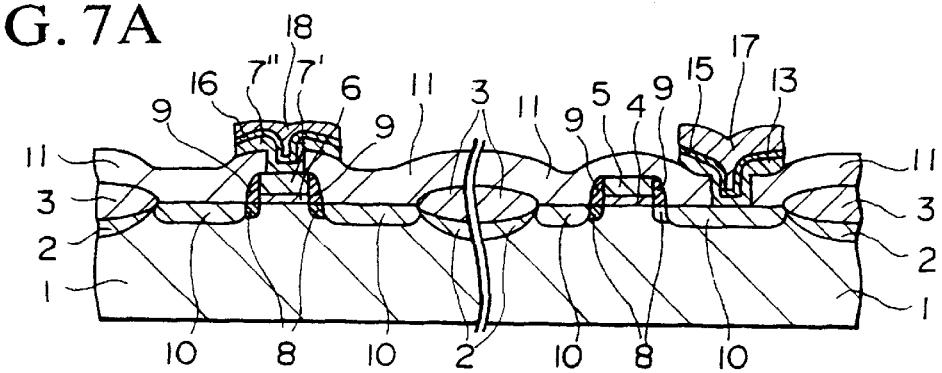
FIGS. 7A to 7D are diagrams for explaining the second half portion of the second embodiment of the first semiconductor memory manufacturing method according to the present invention.

As shown in FIG. 7A, on the n-type layer C, a mask pattern of photoresist (not shown) is formed such that the layer C, the dielectric layer B, and the layer A are removed by etching to form in the region R1 a capacitor upper electrode 17 of the polycrystalline silicon layer C, a capacitor dielectric layer 15 of the dielectric layer B, and a capacitor lower electrode 13 of the polycrystalline silicon layer A, and in the second region R2 a control gate 18 of the layer C, a dielectric layer 16 of the dielectric layer B, and a floating gate upper portion 7" of the layer A. The photoresist is then removed from the substrate 1. The capacitor dielectric layer 15 is formed only on the surface of the capacitor lower electrode 13, and the capacitor upper electrode 17 is formed only on the surface of the capacitor dielectric layer 15. Further, the dielectric layer 16 is formed only on the surface of the floating gate upper portion 7", and the control gate 18 is formed only on the surface of the dielectric layer 16.

Figure 7B:
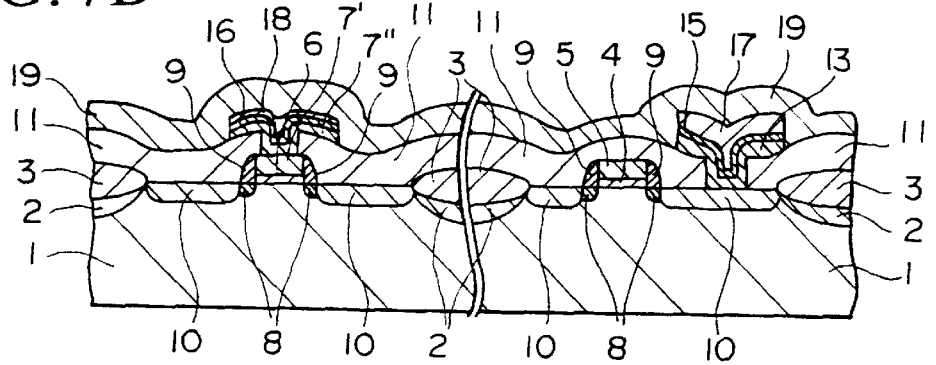

Subsequently, as shown in FIG. 7B, a silicon oxide layer 19 is formed on the overall surface of the silicon substrate 1.

Figure 7C:
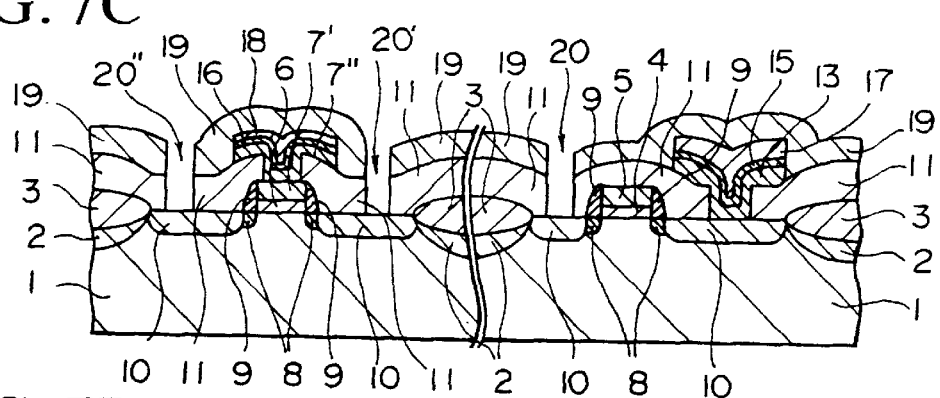

As shown in FIG. 7C, photoresist (not shown) is applied onto the entire surface of the substrate 1 to be patterned into an etching mask. Using the photoresist as a mask, anisotropic dry etching is conducted thereon to produce contact holes 20, 20', and 20" respectively on the n$^+$-type impurity diffusion layer 10 as a source in the first region R1 and on the paired n$^+$-type impurity diffusion layers 10 as source and drain regions in the second region R2.

Figure 7D:
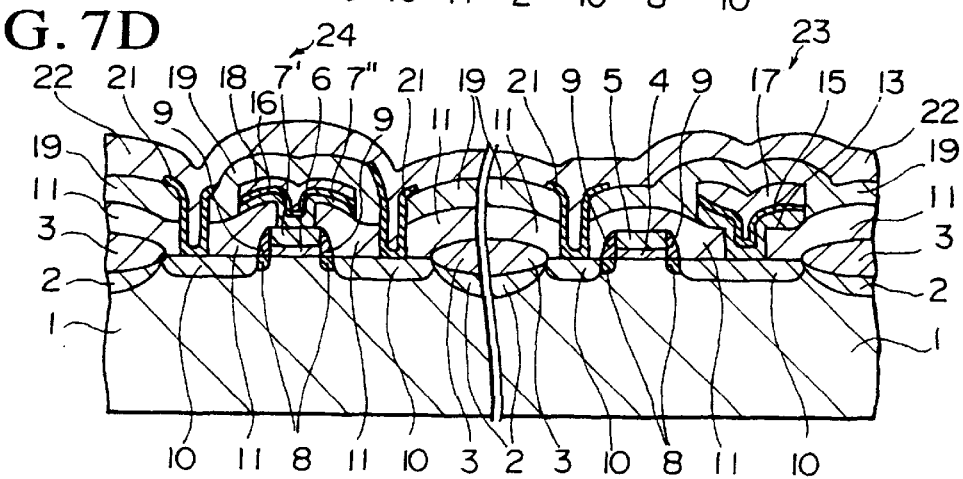

As shown in FIG. 7D, after removing the photoresist, an aluminum layer is fabricated on the entire surface of the substrate 1 by sputtering. Photoresist (not shown) is patterned on the aluminum layer. Using the photoresist as a mask, an aluminum wiring layer 21 is formed in a desired pattern. After removing the photoresist, a silicon oxide layer 22 is fabricated on the entire surface of the substrate 1.

Through the above processes, a DRAM memory cell is fabricated having one transistor for each capacitor in the first element forming region R1, and an electrically rewritable nonvolatile memory cell in the second element forming region R2.

According to the DRAM manufacturing method described above, when producing the DRAM memory cell on the silicon substrate 1 in an ordinary MOS production, the nonvolatile memory cell of the floating gate type can be fabricated on the same silicon substrate 1 without increasing the number of production processes.

Figure 8:
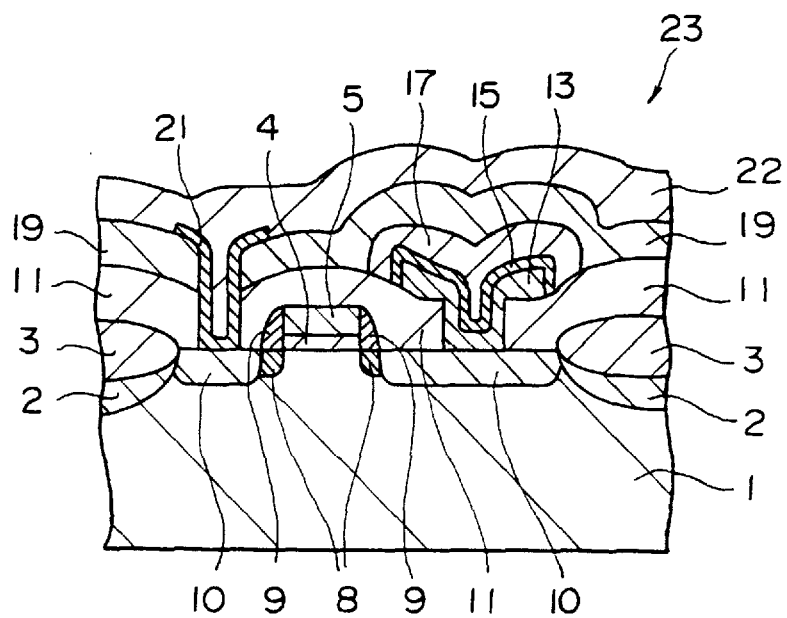
FIG. 8 is a cross-sectional view showing the configuration of a DRAM memory cell for explaining an embodiment of a second semiconductor memory fabricating method according to the present invention.
Figure 9:
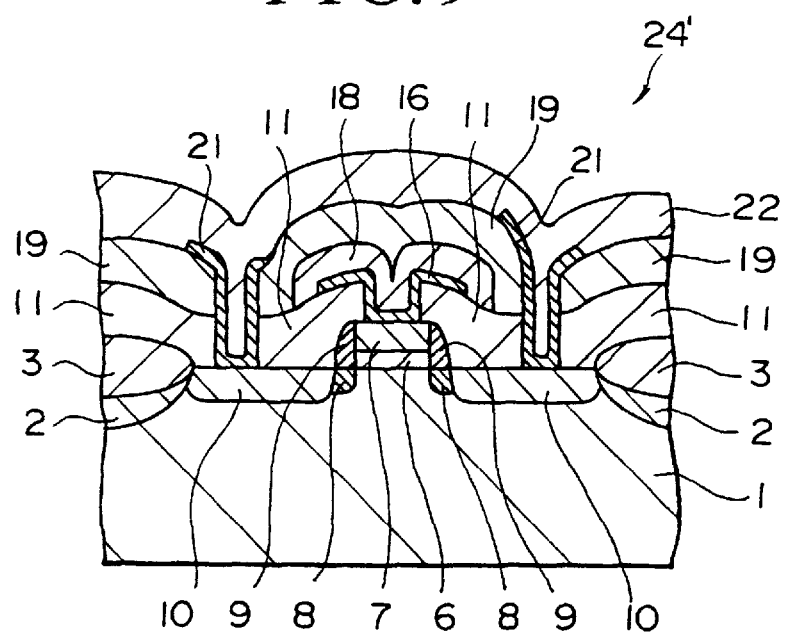
FIG. 9 is a cross-sectional view showing the configuration of a DRAM memory cell for explaining the embodiment of a second semiconductor memory fabricating method according to the present invention.

Referring next to FIGS. 8, 9, 10A to 10D and 11A to 11D, description will be given of the second semiconductor memory manufacturing method according to the present invention. The DRAM produced in accordance with this method has a structure identical to that of the DRAM of FIG. 1A and 1B fabricated by the first embodiment of the first semiconductor memory manufacturing method according to the present invention. As shown in FIG. 8, the DRAM memory cell of the second manufacturing method has also the same construction as that of the DRAM memory cell 23 of FIG. 2. However, a nonvolatile memory cell 24' is different from the nonvolatile memory cell 24 of FIG. 3. Namely, in the cell 24', the dielectric layer 16 is disposed on the floating gate 7 as shown in FIG. 9, whereas in the memory cell 24, the dielectric layer 16 is provided over the floating gate lower portion 7', which corresponds to the floating gate 7, with the floating gate upper portion 7 therebetween.

In the memory cell 24' of FIG. 9, due to the dielectric layer 16 formed on the floating gate 7, the floating gate capacity is decreased when compared with that of the memory cell 24 shown in FIG. 3. Consequently, while the memory cell 24 of FIG. 3 is favorably used in the normally-on state, the memory cell 24' of FIG. 9 is favorably used in the normally-off state.

Referring now to FIGS. 10A to 10D and 11A to 11D, description will be given in detail of the second semiconductor memory manufacturing method according to the present invention. The constituent components of the DRAM memory cell are assigned reference numerals used in FIG. 2. For the components of the nonvolatile memory cell 24", reference numerals of FIG. 3 are used except the floating gate 7. In the DRAM manufacturing method of this embodiment, the DRAM memory cell 23 of FIG. 8 and the nonvolatile memory cell 24' of FIG. 9 are formed respectively in the first and second regions R1 and R2 on the substrate 1.

Figure 10A:
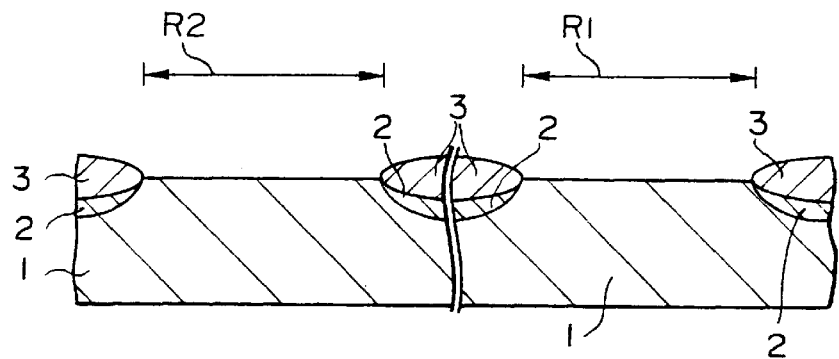
FIGS. 10A to 10D are diagrams for explaining the first half portion of processes of producing the DRAM in the embodiment of the second semiconductor memory manufacturing method according to the present invention in which DRAM memory cells of FIG. 8 are formed in a first element forming region of a silicon substrate and then nonvolatile memory cells of FIG. 9 are fabricated in a second element forming region of the silicon substrate.

On a p-type silicon substrate 1, a silicon oxide layer and a silicon nitride layer (not shown) are formed as pads. Using photoresist (not shown) as a mask, anisotropic dry etching is conducted to remove the silicon nitride layer in other than the regions R1 and R2. As shown in FIG. 10A, $p^+$-type impurity diffusion layers 2 are formed by injecting an impurity substance such as $BF_2$ into the silicon substrate 1. Removing the photoresist, the surface of the substrate 1 is washed. In an atmosphere of $H_2O$, a thermal treatment is conducted for the substrate 1 at a temperature of 1100° C. to selectively oxidize the substrate 1 (LOCOS) so as to fabricate element isolation layers 3 in the element separation regions other than the regions R1 and R2. The silicon nitride layer used as the mask for the thermal treatment is then removed.

Figure 10B:
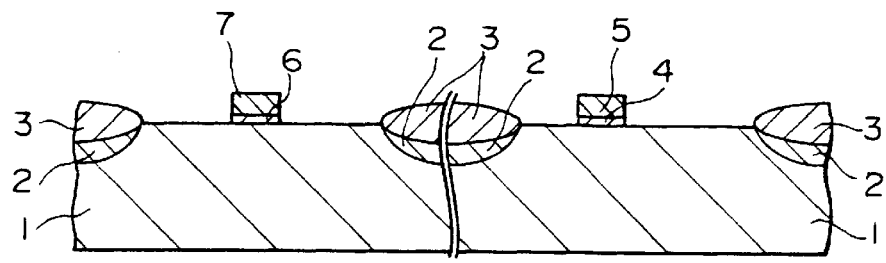

As shown in FIG. 10B, after forming and removing a sacrifice oxide layer (not shown), a silicon oxide layer having a thickness of about 10 nm to about 20 nm is applied entirely onto the regions R1 and R2 to manufacture a gate oxide layer 4 in the first region R1 and a tunnel oxide layer 6 of the nonvolatile memory cell in the second region R2 (first step). To control a threshold value, an impurity substance, such as $BF_2$, is injected into the silicon substrate 1 by ion implantation, and then a polycrystalline silicon layer is formed on the entire surface of the substrate 1. Injecting n-type impurity atoms of phosphor, for example, into the polycrystalline silicon layer, an n-type polycrystalline silicon layer is prepared. Photoresist (not shown) is applied onto the n-type polycrystalline silicon layer and is then patterned. Using the patterned photoresist as a mask, anisotropic dry etching is carried out thereon to produce a gate electrode 5 of an MOS transistor in the first region R1 and a floating gate 7 of the nonvolatile memory cell 24' in the second region R2 at the same time (second step). Then, the anisotropic dry etching may be carried out either on only the polycrystalline silicon layer or on both the silicon oxide layer and the polycrystalline silicon layer.

Figure 10C:
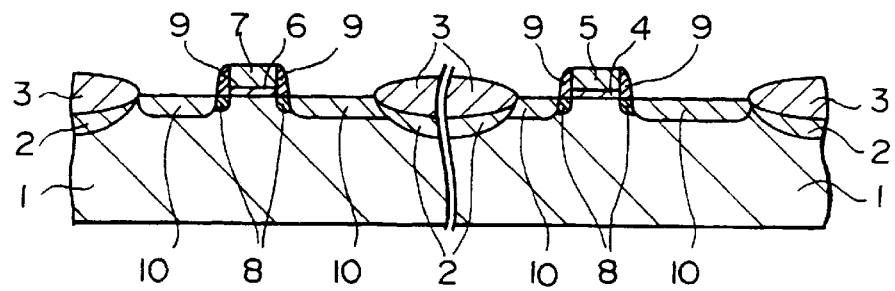

As shown in FIG. 10C, after removing the photoresist, n-type impurity atoms of phosphor, for example, are injected into the overall surface of the silicon substrate 1 by ion implantation using the element isolation layer 3, the gate electrode 5, and the floating gate 7 as masks. A pair of $n^-$-type impurity diffusion layers 8 are formed in the first and second regions R1 and R2, respectively. A silicon oxide layer 5 is formed on the overall surface of the substrate 1 to be subjected to anisotropic dry etching to manufacture sidewall spaces 9 on both sides respectively of the gate electrode 5 and the floating gate 7. Thereafter, using the element isolation layer 3, the gate electrode 5, the floating gate 7, and the sidewall spacers 9 as masks, n-type impurity atoms of phosphor, for example, are injected into the overall surface of the silicon substrate 1 to form a pair of $n^+$-type impurity diffusion layers 10 in the first and second regions R1 and R2, respectively (third step). As a result, an impurity diffusion layer of an LDD structure is formed in the silicon substrate 1.

Figure 10D:
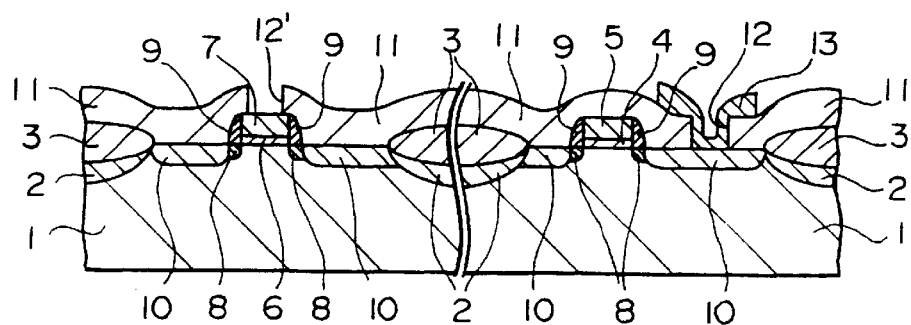

As shown in FIG. 10D, a silicon oxide layer 11 is fabricated on the overall surface of the silicon substrate 1 (fourth step). Anisotropic dry etching is conducted on the layer 11 using photoresist (not shown) as a mask to remove the silicon oxide layer 11 on the $n^+$-type impurity diffusion layer 10 as a drain in the first region R1 and on the floating gate 7 in the second region R2 to produce contact holes 12 and 12' at the same time (fifth step). After removing the photoresist, a polycrystalline silicon layer is formed on the overall surface of the silicon substrate 1, and then n-type impurity atoms of phosphor, for example, are injected into the polycrystalline silicon layer to obtain an n-type polycrystalline silicon layer. Photoresist (not shown) is applied onto the n-type polycrystalline silicon layer and is then patterned. Using the patterned photoresist as a mask, the polycrystalline silicon layer is etched to produce a capacitor lower electrode 13 in the first region R1 (sixth step). In this embodiment, the polycrystalline silicon layer formed on the floating gate 7 in the second region R2 is substantially entirely removed. Thereafter, the photoresist is removed from the substrate 1.

Figure 11A:
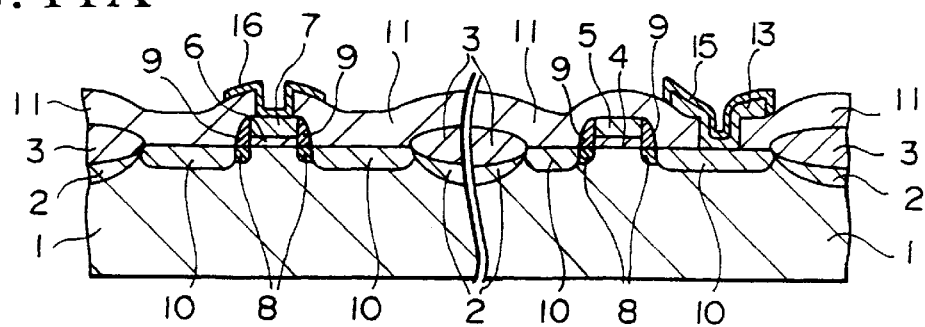
FIGS. 11A to 11D are diagrams for explaining the second half portion of the embodiment of the second semiconductor memory manufacturing method according to the present invention.

Subsequently, as shown in FIG. 11A, using an oxide-nitride-oxide (ONO) layer including a silicon oxide layer, a silicon nitride layer, and a silicon oxide layer, a capacitor dielectric layer 15 is manufactured to cover the capacitor lower electrode 13 in the first region R1, and a dielectric layer 16 is manufactured on the floating gate 7 in the second region R2 (seventh step). In this case, in place of the ONO layer, a dielectric layer of such a ferroelectric material as tantalum oxide ($Ta_2O_5$) or lead (Pz) zirconate titanate (PZT) may be used.

Figure 11B:
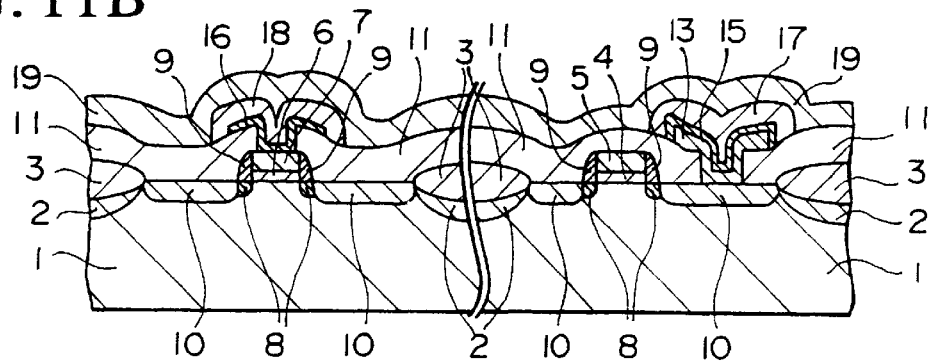

Next, as shown in FIG. 11B, after a polycrystalline silicon layer is formed on the overall surface of the silicon substrate 1, n-type impurity atoms of phosphor, for example, are injected into the polycrystalline silicon layer by ion implantation to obtain an n-type polycrystalline silicon layer. Thereafter, photoresist (not shown) is patterned on the obtained n-type layer such that using the photoresist as a mask, the n-type polycrystalline silicon layer is etched to fabricate a capacitor upper electrode 17 in the first region R1 and a control gate 18 in the second region R2 (eighth step). After removing the photoresist, a silicon oxide layer 19 is formed on the entire surface of the substrate 1.

Figure 11C:
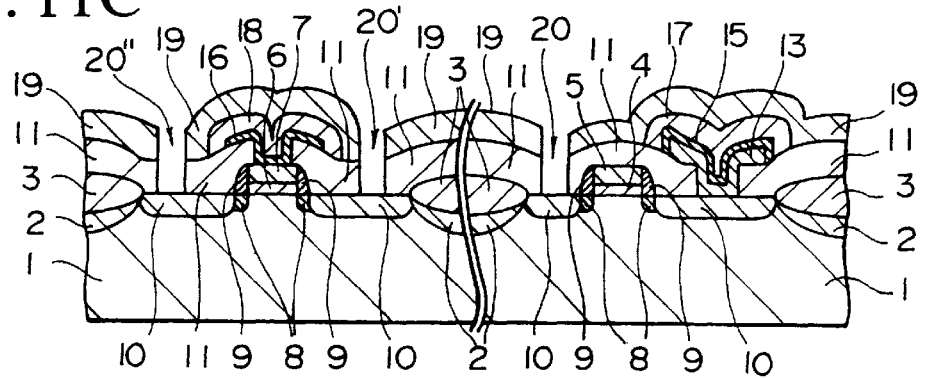

As shown in FIG. 11C, photoresist (not shown) is then applied onto the overall surface of the silicon substrate 1 to be patterned thereafter. Using the patterned photoresist as a mask, the n-type polycrystalline silicon layer is subjected to anisotropic dry etching to fabricate contact holes 20, 20', and 20" respectively on the $n^+$-type impurity diffusion layer 10 as a source in the first region R1 and on the paired $n^+$-type impurity diffusion layers 10 respectively as source and drain regions in the second region R2.

Figure 11D:
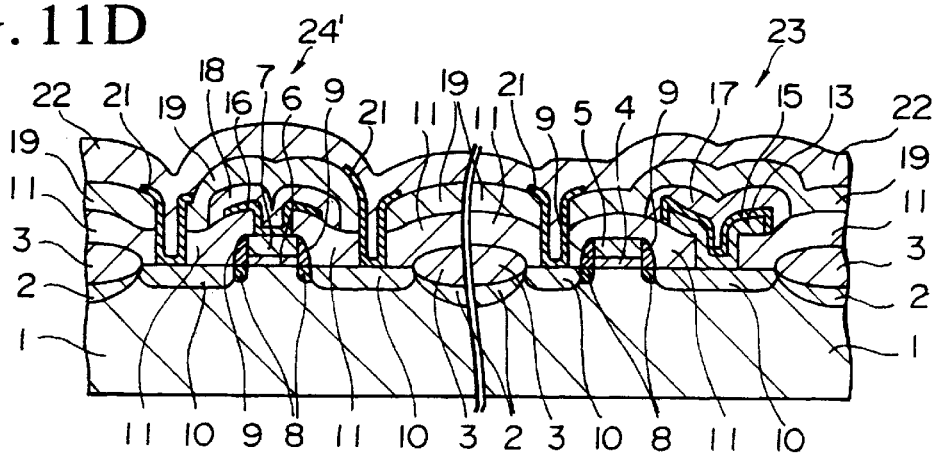

As shown in FIG. 11D, after the photoresist is removed, aluminum is sputtered onto the overall surface of the silicon substrate 1 to form an aluminum layer. Photoresist (not shown) is patterned on the aluminum layer. Using the photoresist as a mask, an aluminum wiring region 21 is fabricated in a desired pattern. After removing the photoresist, a silicon oxide layer 22 is fabricated on the entire surface of the substrate 1.

As a result of the above processes, the DRAM memory cell 23 of the one-transistor-per-capacitor type is produced in the first element forming region R1, and the electrically rewritable nonvolatile memory cell 24' is produced in the second element forming region R2.

According to the DRAM manufacturing method described above, in the embodiment of the second semiconductor memory manufacturing method of the present invention, the contact holes 12 and 12' need not be necessarily produced at the same time in the sixth step shown in FIG. 10D. Namely, the process of FIG. 11A may be executed after the following process.

After the fifth step of FIG. 10D in which the silicon oxide layer 11 is formed on the entire surface of the silicon substrate 1, photoresist (not shown) is applied onto the silicon oxide layer 11. Anisotropic dry etching is conducted thereon by using the photoresist as a mask to remove the silicon oxide layer 11 on the $n^+$-type impurity diffusion layer as a drain in the first region R1 so as to form a contact hole 12. Thereafter, the photoresist is removed and a polycrystalline silicon layer is fabricated on the overall surface of the silicon substrate 1. Photoresist (not shown) is patterned on the n-type polycrystalline silicon layer. Using the photoresist as a mask, the polycrystalline silicon layer is etched to fabricate a capacitor lower electrode 13 in the first region R1. In this step, the polycrystalline silicon layer formed on the second region R2 is substantially entirely removed. Next, photoresist (not shown) is applied onto the overall silicon substrate 1 such that using the photoresist as a mask, anisotropic dry etching is conducted to remove the silicon oxide layer 11 on the floating gate 7 in the second region R2, thereby producing a contact hole 12'. The photoresist is then removed to subsequently conduct the process of FIG. 11A.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory comprising:
    a main section including a first memory cell array including a plurality of first memory cells, each of the first memory cells including one metal-oxide-semiconductor transistor and one capacitor;
    a spare section including a second memory cell array including a plurality of first memory cells, the spare section constituting a redundant circuit;
    an address decoder for specifying addresses respectively of the first and second memory cell arrays; and
    a defective bit replacement control circuit connected to the address decoder, the control circuit including a plurality of second memory cells, each of the second memory cells being an electrically rewritable and nonvolatile memory cell, wherein the address decoder conducts a change-over operation for specification of an address of the first or second memory cell array according to a storage state of the second memory cells in a defective bit replacement operation.

2. A semiconductor memory according to claim 1, wherein the second memory cell is a memory cell of a metal-nitride-oxide-semiconductor type.

3. A semiconductor memory according to claim 1, wherein the second memory cell is a memory cell of a floating-gate type including a floating gate, a control gate, and an insulating film between the floating-gate and the control gate, the insulating film including at least an oxide film and a nitride film.

4. A semiconductor memory according to claim 3, wherein the capacitor of the first memory cell includes a capacitor dielectric layer, the capacitor dielectric layer and the insulating film of the second memory cell are formed simultaneously.

5. A semiconductor memory according to claim 1, wherein the second memory cell is a memory cell of a floating-gate type including a floating gate, a control gate, and ferroelectric film formed between the floating-gate and the control gate.

6. A semiconductor memory according to claim 5, wherein the capacitor of the first memory cell includes a capacitor dielectric layer, the capacitor dielectric layer and the ferroelectric film of the second memory cell are formed simultaneously.

7. A semiconductor memory according to claim 5, wherein the ferroelectric film is a tantalum oxide film or a lead zirconate titanate film.

8. A semiconductor memory according to claim 1, wherein the second memory cell is a memory cell of an EEPROM type.

9. A semiconductor memory for replacing a defective memory cell with a spare memory cell, comprising:
    a main section which includes a first array of first memory cells, wherein each of said first memory cells includes a metal-oxide-semiconductor transistor and a capacitor;
    a spare section which includes a second array of said first memory cells which constitutes replacement memory cells for said main section first array;
    an address decoder for specifying an address within said first and second arrays;
    a control circuit connected to said address decoder for controlling a defective bit replacement operation; and
    means for disabling an address specified for said first array and enabling an address specified for said second array in response to said control circuit, said means including a plurality of electrically erasable, nonvolatile second memory cells which have a state determined by said control circuit to disable addressing of a defective memory cell location in said first array and to enable addressing of a replacement memory cell in said second array, in the defective bit replacement operation.

10. A semiconductor memory according to claim 9, wherein each of said second memory cells includes a metal-nitride-oxide-semiconductor memory cell.

11. A semiconductor memory according to claim 9, wherein the second memory cell is a memory cell of a floating-gate type including a floating gate, a control gate, and an insulating film between the floating-gate and the control gate, the insulating film including at least an oxide film and a nitride film.

12. A semiconductor memory according to claim 11, wherein the capacitor of the first memory cell includes a capacitor dielectric film, the capacitor dielectric film and the insulating film of the second memory cell are formed simultaneously.

13. A semiconductor memory according to claim 9, wherein the second memory cell is a memory cell of a floating-gate type including a floating gate, a control gate, and a ferroelectric film formed between the floating-gate and the control gate.

14. A semiconductor memory according to claim 13, wherein the capacitor of the first memory cell includes a capacitor dielectric layer, the capacitor dielectric layer and the ferroelectric film of the second memory cell are formed simultaneously.

15. A semiconductor memory according to claim 13, wherein the ferroelectric film is a tantalum oxide film or a lead zirconate titanate film.

16. A semiconductor memory according to claim 9, wherein the second memory cell is a memory cell is a memory cell of an EEPROM type.

* * * * *